(12) United States Patent
Didenko et al.

(10) Patent No.: US 7,811,543 B2
(45) Date of Patent: Oct. 12, 2010

(54) CONTROLLED SYNTHESIS OF NANOPARTICLES USING CONTINUOUS LIQUID-FLOW AEROSOL METHOD

(75) Inventors: Yuri T. Didenko, Savoy, IL (US); Yuhua Ni, Champaign, IL (US)

(73) Assignee: Irilliant, Inc., Mountain View, CA (US)

( * ) Notice: Subject to any disclaimer, the term of this patent is extended or adjusted under 35 U.S.C. 154(b) by 0 days.

(21) Appl. No.: 12/287,530

(22) Filed: Oct. 9, 2008

(65) Prior Publication Data

US 2010/0028249 A1 Feb. 4, 2010

Related U.S. Application Data

(63) Continuation-in-part of application No. 11/734,172, filed on Apr. 11, 2007, now abandoned.

(51) Int. Cl.
*C01G 1/00* (2006.01)
(52) U.S. Cl. .................. 423/509; 423/561.1; 423/566.1; 423/592.1; 423/604; 423/606; 423/618; 423/633; 423/594.19; 423/622; 977/773; 977/774; 977/775; 977/811; 977/824
(58) Field of Classification Search ................. 423/509, 423/561.1, 566.1, 592.1, 604, 633, 594.19, 423/622, 606, 618; 977/773, 774, 775, 811, 977/824

See application file for complete search history.

(56) References Cited

U.S. PATENT DOCUMENTS

| 5,096,566 | A | 3/1992 | Dawson et al. |
| 5,236,353 | A | 8/1993 | Adani et al. |
| 6,179,912 | B1 | 1/2001 | Barbera-Guillem et al. |
| 7,160,489 | B2 | 1/2007 | Didenko et al. |
| 2002/0136769 | A1 | 9/2002 | Kabanov et al. |
| 2004/0072683 | A1 | 4/2004 | Kodas et al. |
| 2005/0112849 | A1 | 5/2005 | Stott et al. |
| 2006/0140868 | A1 | 6/2006 | Grancharov et al. |
| 2006/0244164 | A1 | 11/2006 | Didenko et al. |

(Continued)

OTHER PUBLICATIONS

"A novel ultrasound-assisted approach to the synthesis of CdSe and CdS nanoparticles" by Hong-liang Li et al., Journal of Solid State Chemistry, vol. 172, Issue 1, Apr. 2003, pp. 102-110.*

(Continued)

*Primary Examiner*—Timothy C Vanoy
(74) *Attorney, Agent, or Firm*—Thomas M. Freiburger

(57) ABSTRACT

A method and apparatus for producing surface stabilized nanometer-sized particles includes the steps of mixing reactants, a surface-stabilizing surfactant, and a high boiling point liquid to form a mixture, continuously passing the mixture through an ultrasonic spray nozzle to form a mist of droplets of the mixture, injecting the mist directly into a furnace to cause a reaction between species of the mixture, and collecting the nanometer-sized products. The ultrasonic nozzle is positioned directly at one end of the heating furnace, preferably the top end, for travel of the droplets through the furnace. The continuous liquid-flow process, along with certain operating parameters, eliminates the need for dilution of the high boiling point liquid with a low boiling point solvent as in the prior art, significantly increases the yield, improves the quality of the product, and makes the process scalable.

23 Claims, 5 Drawing Sheets

U.S. PATENT DOCUMENTS

2008/0193638 A1  8/2008  McMaster et al.

OTHER PUBLICATIONS

"Nanostructured Materials Generated by High-Intensity Ultrasound: Sonochemical Synthesis and Catalytic Studies" by Kenneth S. Suslick et al., Chem. Mater., (1996) vol. 8, pp. 2172-2179.*

"Pulsed Sonochemical Synthesis of Cadmium Selenide Nanoparticles" by Y. Mastai et al., J. Am. Chem. Soc., (1999), vol. 121, pp. 10047-10052.*

"Ultrasonic synthesis of nanocrystals of metal selenides and tellurides" by Jian-Ping Ge et al., J. Mater. Chem., (2003), vol. 13, pp. 911-915.*

"Magnetic and Porous Nanospheres from Ultrasonic Spray Pyrolysis" by Won Hyuk Suh et al., J. Am. Chem. Soc., (2005), vol. 127, No. 34, pp. 12007-12010.*

"Synthesis of CeO2 nanoparticles by salt-assisted ultrasonic aerosol decomposition" by B. Xia, J. Mater. Chem., (2001), vol. 11, pp. 2925-2927.*

Kodas, T.T. Kodas, Hampden-Smith, M., "Aerosol Processing of Materials", Wiley: New York, 1999, pp. 440-460.

Alivisatos, A.P., "Perspectives on the Physical Chemistry of Semiconductor Nanocrystals", J. Phys. Chem., 1996, vol. 100, No. 31: pp. 13226-13239.

Eychmuller, Alexander, "Structure and Photophysics of Semiconductor Nanocrystals", J. Phys. Chem., 2000, vol. 104, No. 28, pp. 6514-6528.

Murray, C.B. et al, "Synthesis and Characterization of Monodisperse Nanocrystals and Close-Packed Nanocrystal Assemblies", Annu. Rev. Mater. Sci. 2000, vol. 30, pp. 545-610.

O'Brien, P. et al, "Nanocrystalline Semiconductors: Synthesis, Properties and Perspectives", Chem. Mater., 2001, vol. 13, No. 11, pp. 3843-3858.

Grieve, Karen et al, "Synthesis and Electronic Properties of Semiconductor Nanoparticles/Quantum Dots", Current Opinion Coll. Interface Sci., 2000, vol. 5, pp. 168-172.

Bonnemann, Helmut et al, "Nanoscopic Metal Particles—Synthetic Methods and Potential Applications", Eur. J. Inorg. Chem, 2001, pp. 2455-22480.

Bruchez Jr., M. et al, "Semiconductor Nanocrystals as Fluorescent Biological Labels," Science (Washington D.C.) 1998, vol. 281, pp. 2013-2016.

Chan, W. C. W. et al, "Quantum Dots Bioconjugates for Ultrasensitive Nonisotopic Detection," Science (Washington D.C.), 1998, vol. 281, pp. 2016-2018.

Huynh, W. U. et al, "Controlling the Morphology of Nanocrystal-Polymer Composites for Solar Cells," Adv. Funct. Mater, 2003, vol. 13, pp. 73-79.

Klimov, V. I. et al, "Optical Gain and Stimulated Emission in Nanocrystal Quantum Dots," Science (Washington D.C.), 2000, vol. 290, pp. 314-317.

Eisler, H-J. et al, "Color-Selective Semiconductor Nanocrystal Laser," Appl. Phys. Lett., 2000, vol. 80, pp. 4614-4616.

Thurston, T. R et al, "Photoxidation of Organic Chemicals Catalyzed by Nanoscale MoS2," J. Phys. Chem. B., 1999, vol. 103, pp. 11-17.

Lin, X.Z. et al, "Synthesis of Silver Nanoparticles in a Continuous Flow Tubular Microreactor", Nano Lett., 2004, vol. 4, pp. 2227-2232.

Peng, L. Qu et al, "Control of Photoluminescence Properties of CdSe Nanocrystals in Growth," J. Am. Chem. Soc. 2001, vol. 124, pp. 2049-2055.

Striolo, A. Striolo et al, "Molecular Weight, Osmotic Second Virial Coefficient, and Extinction Coefficient of Colloidal Nanocrystals," J. Phys. Chem. B, 2002, vol. 106, pp. 5500-5505.

Larson, D. et al, "Water-Soluble Quantum Dots for Multiphoton Fluorescence Imaging In Vivo," Science (Washington D.C.), 2003, vol. 300, pp. 1434-1436.

Gur, I. et al, "Air-Stable All-Inorganic Nanocrystal Solar Cells Processed from Solution," Science, 2005, vol. 310, pp. 462-466.

Coe, S. et al, "Electroluminescence from Single Monolayers of Nanocrystals in Molecular Organic Devices," Nature, 2002, vol. 420, pp. 800-803.

Green, M. Green, et al, "Recent Advances in the Preparation of Semiconductors as Isolated Nanometric Particles: New Routes to Quantum Dots," Chem. Commun., 1999, pp. 2235-2241.

Colvin, V. L. et al, "Light-Emitting Diodes Made from Cadmium Selenide Nanocrystals and a Semiconductor Polymer," Nature (London), 1994, vol. 370, pp. 354-357.

Huynh, W. U. et al, "Hybrid Nanorod-Polymer Solar Cells," Science (Washington D.C.), 2002, vol. 295, pp. 2425-2427.

Patterson, A.L., "The Scherrer Formula for X-Ray Particle Size Determination" (Nov. 1939), Phys. Rev. vol. 56, pp. 978-982.

* cited by examiner 90 cm long reactor 150 cm long reactor 150 cm long reactor

CONTROLLED SYNTHESIS OF NANOPARTICLES USING CONTINUOUS LIQUID-FLOW AEROSOL METHOD

This application is a continuation-in-part of application Ser. No. 11/734,172, filed Apr. 11, 2007, now abandoned.

FEDERALLY SPONSORED RESEARCH OR DEVELOPMENT

This invention was made with Government support under SBIR Grant award No. OII-0539385 by the National Science Foundation (NSF). The Government has certain rights in the invention.

BACKGROUND OF THE INVENTION

The present invention relates to methods for controlled production of surface stabilized particles, such as semiconductor nanoparticles, nanooxides and nanometals (also called nanocrystals or quantum dots) and apparatus for such manufacture.

It is anticipated that the future will be the era of nanotechnology. Through nanotechnology, higher quality products can be made by using smaller amounts of materials to achieve the same desired effects. Customers will receive products at lower costs with greater functionality in smaller packages.

Particles with their smallest dimension between 1 to 100 nm have generated great scientific and commercial interest due to their size-dependent properties and potential uses in electronics, fluorescent imaging, medicine, the chemical industry and everyday life. These size-dependent properties are usually observed at particle sizes below about 20 nm and include the decrease of the material's melting point and a change in the absorbance and/or emission wavelengths depending on the size—quantum size effect. See e.g., Alivisatos, A. P. (1996), "Perspectives on the physical chemistry of semiconductor nanocrystals," *J. Phys. Chem.* 100(31): 13226-13239; Eychmuller, A. (2000), "Structure and photophysics of semiconductor nanocrystals," *J. Phys. Chem. B* 104(28): 6514-6528; C. B. Murray, C. R. Kagan, M. G. Bawendi (2000), "Synthesis and characterization of monodisperse nanocrystals and close-packed nanocrystal assemblies," *Ann. Rev. Mater. Sci.* 30: 545-610; M. Green, P. O'Brien (1999), "Recent advances in the preparation of semiconductors as isolated nanometric particles: new routes to quantum dots," *Chem. Commun.:* 2235-2241; T. Trindadae, P. O'Brien, N. L. Pickett (2001), "Nanocrystalline semiconductors: synthesis, properties and perspectives," *Chem. Mater.* 13: 3843-3858; K. Grieve, P. Mulvaney, F. Grieser (2000), "Synthesis and electronic properties of semiconductor nanoparticles/quantum dots," *Current Opinion Coll. Interface Sci.* 5: 168-172; H. Bönnemann, R. M. Richards (2001), "Nanoscopic metal particles—synthetic methods and potential applications," *Eur. J. Inorg. Chem.* 2455-22480.

The decreased melting point can be used, for example, to melt nanosilver at low temperatures for flexible printed circuits. In another example, CdSe nanoparticles with sizes from 2 to 6 nm strongly absorb and emit light that ranges in color from blue to red, depending on the size of particles. Nanoparticles that show quantum size effects or size-dependent properties are usually called quantum dots (QDs, q-dots). They can be used for light emitting diodes (LED), lasers, displays, optical devices, as catalysts etc. (see V. L. Colvin, M. C. Schlamp, A. P. Alivisatos (1994), "Light-emitting diodes made from cadmium selenide nanocrystals and a semiconductor polymer," *Nature* (London) 370: 354-357); biological fluorescent labels (see M. Bruchez Jr., M. Moronne, P. Gin, S. Weiss, A. P. Alivisatos (1998), "Semiconductor nanocrystals as fluorescent biological labels," *Science* (Washington D.C.) 281: 2013-2016; and W. C. W. Chan, S. Nie (1998), "Quantum dots bioconjugates for ultrasensitive nonisotopic detection," *Science* (Washington D.C.) 281: 2016-2018); solar cells (see W. U. Huynh, J. J. Dittmer, A. P. Alivisatos (2002), "Hybrid Nanorod-Polymer Solar Cells," *Science* (Washington D.C.) 295: 2425-2427; and W. U. Huynh, J. J. Dittmer, W. C. Libby, G. L. Whiting, A. P. Alivisatos (2003), "Controlling the morphology of nanocrystal-polymer composites for solar cells," *Adv. Funct. Mater.* 13: 73-79); lasers (see V. I. Klimov, A. A. Mikhilovsky, S. Xu, A. Malko, J. A. Hollingsworth, D. W. McBranch, C. A. Leatherdale, H-J. Eisler, M. G. Bawendi (2000), "Optical gain and stimulated emission in nanocrystal quantum dots," *Science* (Washington D.C.) 290: 314-317; and H-J. Eisler, V. C. Sundar, M. G. Bawendi, M. Walsh, H. I. Smith, V. I. Klimov (2002), "Color-selective semiconductor nanocrystal laser," *Appl. Phys. Lett.* 80: 4614-4616); and catalysts (see T. R Thurston, J. P. Wicoxon (1999), "Photoxidation of organic chemicals catalyzed by nanoscale $MoS_2$," *J. Phys. Chem. B.* 103: 11-17).

Nanoparticles are finding widespread applications ranging from composites and coatings to cosmetic creams offering ultraviolet radiation protection. According to a Moore and Michelson report (Woodrow Wilson Int. Center for Scholars, April 2006) currently there are about 212 nanoproducts on the market worldwide. Silver nanoparticles are used as an antibacterial agent in clothing and wound dressing. Nano-oxides are used in the cosmetic industry as sun protection creams, paints, catalysts, in synthetic bones, and as polishing material for silicon wafers. Carbon nanoparticles are used in many commercial products, such as tennis rackets and paint additives. Fluorescent nanoparticles (quantum dots) have commercial applications in bio-labeling, bio-detection, drug delivery and bio-analysis. Future applications of quantum dots include solar cells, lasers, LEDs, flat panel displays, and others. Nanometals can be used as catalysts, in bio-detection, as antibacterial agents and in many other applications.

Currently, colloidal nanoparticles are produced in batch methods on a small scale, which only produces gram-scale quantities, or by using microfluidic reactors which can treat less than 0.3 mL/min of precursor solutions (Barbera-Guillem et al., "Continuous Flow Process for Production of Semiconductor Nanocrystals", U.S. Pat. No. 6,179,912, Jan. 30, 2001; X. Z. Lin, A. D. Terepka, H. Yang (2004), "Synthesis of Silver Nanoparticles in a Continuous Flow Tubular Microreactor", Nano Lett., 4:2227-2232; Stott, Nathan E. et al., "Method of Preparing Nanocrystals", U.S. patent application No. 2005/0112849, May 26, 2005).

The current production limitations for these particles lead to a relatively high price. For example, the current price for fluorescent cadmium selenide quantum dots varies from $2,100 (NN-Labs, LLC) to $20,000/g (Aldrich). Among other weaknesses of these technologies is their inability to generate reproducible results from one batch to another because the reaction rates are rapid and difficult to control at the necessary high temperatures. Thus, each batch of particles will have slightly different sizes and size distribution. Combining particles from different batches will only broaden the size distribution of the product.

Another approach for the synthesis of nanoparticles is a gas phase reaction which produces nanoparticles at high temperatures in the reactor (See book review T. T. Kodas, M. Hampden-Smith, 1999, "Aerosol Processing of Materials", Wiley: New York, 1999). The time of reaction is short and the cooling rate is high. Thus, obtained particles do not sinter and have a small size from a few nanometers to hundreds of nanometers in diameter. Oxides and nanometals can be obtained by this procedure. The drawbacks of such processes are the broad size distribution, irregular shape, and aggregation of the primary particles.

Synthetic procedures of the invention differ from traditional aerosol processes. In our procedure as described below, we add surfactants to the reaction mixture, and the reaction proceeds in small droplets of a high boiling point solvent. The temperature inside the reactor is lower than the boiling point of the solvent, so the reaction proceeds inside the droplets of aerosol. The mechanism of reactions inside the droplets is similar to the mechanism of batch nanoparticle synthesis reactions in small chemical glassware. The synthesized particles are in colloidal form and soluble in organic solvents. The particles do not agglomerate during storage and can stay in soluble form for a long time. The particle quality is higher relative to size, shape, and size distribution, as compared to the quality of particles made by traditional gas-phase reaction methods.

The present invention overcomes deficiencies in prior U.S. Pat. No. 7,160,489, issued Jan. 9, 2007, which also used chemical aerosol-flow synthesis to synthesize CdSe of nanometer size (Y. T. Didenko, K. S. Suslick, "Controlled Chemical Aerosol Flow Synthesis of Nanometer-Sized Particles and Other Nanometer-Sized Products", that patent being fully incorporated herein by reference. In this previous work, the mist was created using a household ultrasonic humidifier working at high frequency of 1.7 MHZ, and it was not possible to create a mist from high boiling point solvents alone. The mixture had to be diluted with toluene, a lower boiling point solvent, to ease the transfer of the reaction mixture to the vapor phase. The additional dilution of the precursors solution with low boiling point solvent (toluene) was a prerequisite for mist formation. This dilution decreased the yield and the quality of the quantum dots produced. The size distribution of the quantum dots was broader than desired and a bubbler containing toluene was required to collect nanoparticles produced. Another drawback was that the same solution was sonicated in the same vessel for a long period of time to mist all of the precursors solution mixture. This created the possibility of sonochemically driven reactions in some reaction solutions. Thus, the previously patented aerosol synthesis approach was limited to producing nanoparticles of lower quality, and the production rate of nanoparticles was limited due to low production rate of aerosol from ultrasonic humidifiers.

The size of liquid droplets formed by ultrasonic humidifier used in the previous system (working at 1.7 MHZ ultrasound frequency) was small, about 5 microns. In the current invention, the continuous liquid-flow system produces droplets preferably between 1 and 100 microns in diameter with a most preferable droplet size of about 40 microns.

The positioning of the sprayer directly at one end of the furnace, and preferably on top of the furnace, and the larger size of droplets decrease the residence time of the droplets inside the reactor as compared to the system of the patent. From the patent it was not obvious that reduced residence time would provide a high yield of high quality nanoparticle product. By controlling the size of the furnace (diameter and length), the liquid and the gas flow through the reactor, and the ratio of chemical components in the reaction mixture, it is possible to produce higher quality nanoparticles in a wide range of sizes than the system of the referenced patent.

This present invention provides a new, scalable, and inexpensive method for manufacturing surface stabilized nanoparticles. The nanoparticles are produced using a liquid flow method in which a solution of high boiling point solvent containing precursors flows through a vibrating nozzle, excited by high intensity ultrasound, thus allowing continuous production of droplets. A dense mist of droplets is injected directly into the furnace. The product of the chemical reaction is easily collected at the exit of the reactor, since products (nanoparticles) are dissolved in high boiling point solvent which easily agglomerates or coalesces at room temperature or well above room temperatures. Thus, the advantages of this approach are: a scalable and higher-production process for producing droplets of high boiling point solvent containing nanoparticle precursors and capping agents, a simple method of particle collection, and higher quality nanoparticle product than in previous processes.

This vertical approach, with the sprayer nozzle preferably on top of the furnace, has many advantages, including: full use of precursors from the initial mixture; a flexible production method with the option of changing gas and liquid flow rates independently; a simple collection method (since the nanoparticles are directly confined within the droplets, the droplets and nanoparticles contained within can be directly trapped in a receiving bottle at the output of the reactor); the mixture will not undergo sonochemical reactions in the ultrasonic cell, because sonication only takes place during the short time of atomization; and production yield can easily be scaled up by using commercial spray sources.

The maximum yield of CdSe nanoparticles from previous production system described in the referenced U.S. Pat. No. 7,160,489 was small, about 70 mg/hour. The production apparatus using a continuous liquid flow aerosol production technique described herein allows yields at 15 to 20 times increase in production rate, to about 1 to 1.5 g/hour, and production could be further scaled up. The production rate is only limited by the length and diameter of the reactor tube, i.e. the furnace. The resulting quality of the quantum dots produced is also very good, as indicated by transmission electron microscopy, as well as absorbance and emission measurements. Absorbance and emission are well-known indicators of quantum dot quality. Thus, the quality of quantum dots can be an indication of the performance of the method. The CdSe nanoparticles produced have a fluorescence quantum yield (QY) about 40-50%, with full width at the half maximum (FWHM) about 28-30 nm, and our CdTe q-dots have QY about 40% with FWHM about 30 nm. These are very good numbers and comparable to the best quantum dots published in literature.

The anticipated advances in q-dots applications will require large quantities of inexpensive materials. Currently, the limited number of high-priced nanomaterials products on the market hinders the development of new devices, methods and products. In the future, with improved production methods, the price should drop from thousands of dollars per gram to hundreds of dollars per gram. New applications of quantum dots and new companies based on these applications emerge every day. The demand for nanoparticles is urgent and will accelerate in the next few years. It is imperative to satisfy these demands by creating a technology that will produce high quality quantum dots in the most inexpensive way.

SUMMARY OF THE INVENTION

This invention is focused on the synthesis of surface stabilized nanoparticles from an aerosol of a high boiling point solvent. In a traditional spray pyrolysis method, an aerosol generator creates droplets from a solution containing selected precursors that are subsequently carried by an appropriate (inert or reactive) gas into a simple tube furnace as a reactor. As the droplets pass through the reactor, solvent evaporates from the droplets and the dissolved substances react, precipitate, or decompose to form a uniform spherical powder carried by the gas stream. Ultrasound spray pyrolysis (USP) is a variant of the spray pyrolysis methods. A major advantage of USP is that each droplet, and consequently each particle formed, is subjected to the same reaction conditions, primarily because of uniformity in the droplets. Thus, the chemical and phase compositions of all particles are the same. The particles may be trapped in a liquid, or may be used to coat a solid surface.

One of the main differences between traditional USP techniques and the invention described here is that in this invention the reaction mixture consists of high boiling point solvents containing surface active agents, which stabilize particles during their growth and chemical reactions. The temperature of the furnace is lower than the boiling point of the solvent, so the solvent does not significantly evaporate; and the synthesis reaction thus proceeds in small droplets of this high boiling point solvent as in U.S. Pat. No. 7,160,489, but the invention makes improvements over the process of the patent. We call this method a chemical aerosol-flow synthesis, or CAFS.

The CAFS method has many advantages. The synthesis proceeds in isolated micro-scale reactors (i.e., liquid droplets) carried in a gas carrier at a controlled temperature. The temperature is selected for the specific nanoparticle synthesis reaction. Most preferably a high boiling point solvent is used, and the reaction temperature is elevated above room temperature. The reaction zone is separated from the initial mixture, which is kept at a lower temperature than the temperature of the reaction zone. Nanocrystals can be obtained in any desired quantity with high quality and reproducibility once the parameters of the procedure are established. The obtained nanoparticles can be easily deposited on desired surfaces or collected at low temperatures in desired solvent.

At present, ultrasonic horn atomizers (Sono-Tek Co. and others) are used pursuant to the invention to produce the mist from high boiling point solvents. These atomizers work at ultrasound frequency (about 60 kHz, or preferably in a range of about 20 kHz to 120 kHz) and are capable of producing mists from high boiling point and viscous solvents. These atomizers work in the flow regime, which allows delivery of the mixture directly to the heating zone. We use a sprayer preferably in the vertical position, directly on the top of the heating zone (FIG. 1). Other sprayers, however, can be used in any other position depending on the configuration of setup needed. As an example, the injection of droplets from the nozzle could be upward from the bottom end of a tubular furnace, with a flowing gas carrying the droplets upward through the furnace.

The process described herein can be used to synthesize a wide range of nanomaterials, including semiconductor nanoparticles, nanometals, nanooxides and their composites. Precursors for the manufacture of such products in accordance with the present invention include cadmium, zinc, silver, copper, molybdenum and other metal precursors, chalcogenide (e.g., sulfur, selenium, and tellurium) precursors, and metal salts as metal and oxide precursors.

In accordance with the present invention, chemical reactions occur in aerosol. The reaction proceeds inside tiny liquid droplets, containing reactants and a surface stabilizer or surfactant.

The size, quality, and the yield of nanoparticles can be controlled by the temperature of the hot-wall reactor, by the residence time of the reactants inside the reactor, by the length of the reactor and by the ratio of surfactants or the ratio of surfactant to precursor concentrations. Under certain configurations of the length of the reactor, diameter of the reactor and flow rate of the liquid mixture and transport gas, the collection of the resulting nanoparticles can be performed in two distinct regions at the same time, at the lower end of the furnace: centrally; and from the wall of the furnace, where droplets tend to coalesce on the wall and to form nanoparticles of larger size. This dual fraction collection method can occur when a significant portion of the spray generated by the nozzle is designed to flow against the reactor wall. When that happens, and since the liquid dripping down the wall of the reactor takes longer to traverse the reactor compared to the spray of droplets traveling down the middle of the reactor, the resident time for the product collected from the wall is longer than that collected from the center of the reactor. Longer resident times correspond to longer growth times and thus larger nanoparticles, compared to those generated by the droplets that traveled faster through the center of the reactor. This facilitates the simultaneous collection of two different size particles, and with the two collections of particles being segregated. Thus it can further improve the throughput of the process.

DESCRIPTION OF PREFERRED EMBODIMENTS

The invention is related to the scale-up of direct synthesis of nanoparticles from aerosol. The process is continuous, uses inexpensive chemicals and is a preferential method for large scale production of colloidal nanoparticles for future technology needs.

The method is universal for the synthesis of various nanoparticles. Semiconductors, oxides, metal and elemental nanoparticles can be synthesized with high yield and high quality.

The size of nanoparticles can be controlled by adjusting the length of the reactor, furnace temperature, gas and liquid flow through the sprayer; and by changing the nature of capping agent and the chemical composition of the solution mixture.

Using the process of the invention, cadmium and zinc chalcogenides, silver, copper, nickel, cobalt metal and zinc and iron oxide nanoparticles were produced from organic solvents at high temperature.

The methods of the invention allow for the continuous and controlled generation of nanometer-sized products of desired size, shape and composition. In accordance with the described methods, particle sizes can be obtained in the desired 1 to 20 nm region. Larger nanoparticles are also possible to produce.

Figure 1:
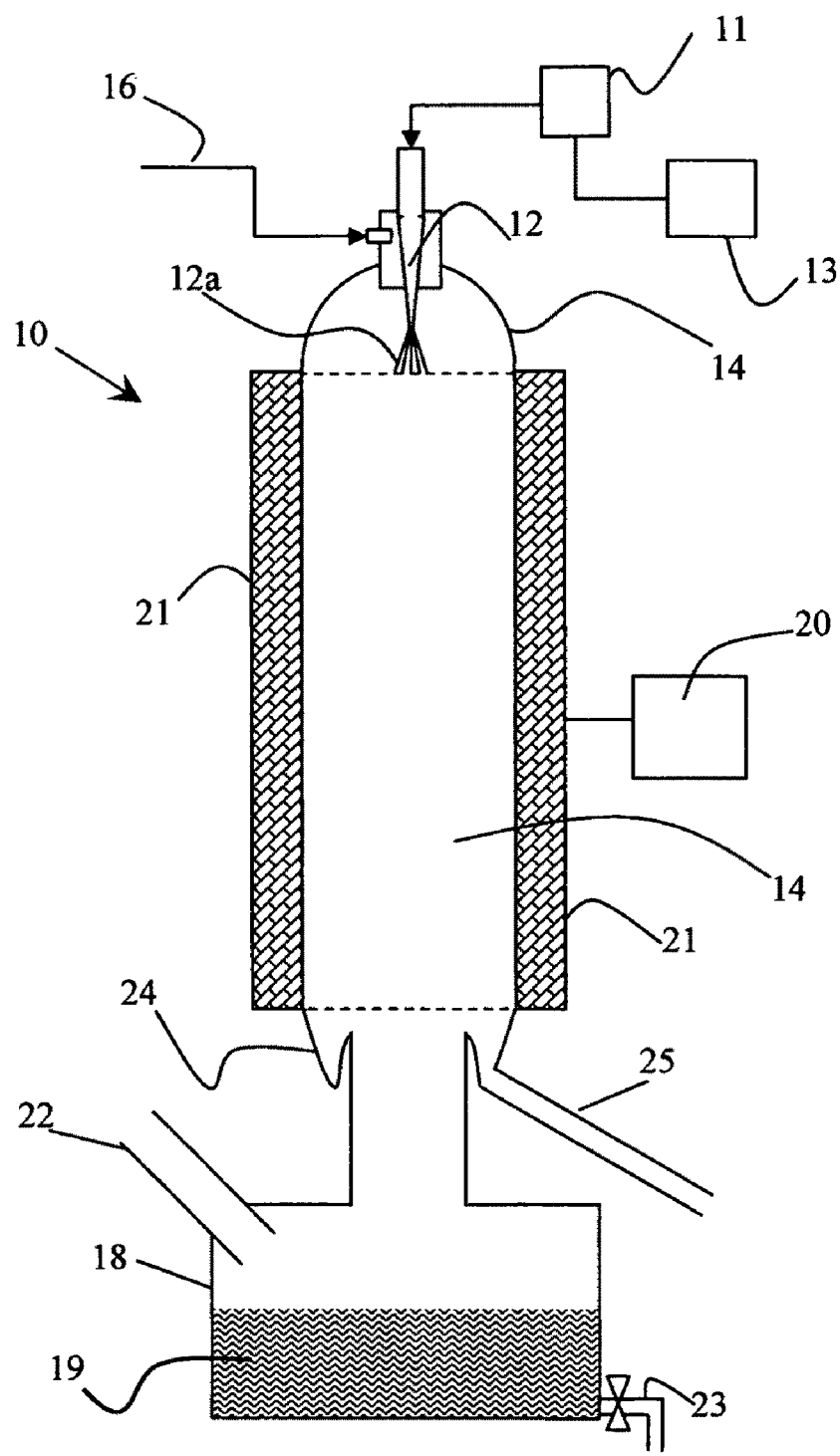
FIG. 1 illustrates in schematic elevation view, an apparatus for chemical aerosol flow synthesis in accordance with a preferred embodiment of the present invention.

FIG. 1 illustrates an apparatus 10 for synthesis in accordance with a preferred embodiment of the present invention. As shown in FIG. 1, a liquid mixture 13 of precursors, surface stabilizers, and solvent, is driven by a feeding pump 11 into an ultrasound horn or spray nozzle 12, to create a spray or mist of droplets 12a of said mixture. The droplets 12a travel through a heated reactor or furnace 14. The droplets 12a can also be further assisted traveling through the furnace by a gas 16, which can be delivered from concentrically around the liquid feed chamber of the vibrating nozzle. The gas 16 can be an inert gas or a chemically active gas. For example, a chemically active gas may be used when one wishes to modify the surface and/or chemical composition of obtained nanoparticles by reacting them with the chemicals of the chemically reactive gas.

For example, an ultrasonic sprayer working at 60 kHz and about 3 W of acoustic power atomizes the liquid mixture into droplets. An example of a suitable aerosol generator is a Sono-Tek ultrasonic sprayer (e.g. model 04678) coupled with a Sono-Tek broadband ultrasonic generator (model 06-05108) (Sono-Tek Corporation, Milton, N.Y.). Others are available from Sonics and Materials and others. As illustrated, the sprayer preferably is a t the top of the heating chamber to establish a vertical flow down through the chamber. Although in this configuration the spray velocity and gravity could be relied on alone, the droplets preferably are carried through the furnace 14 by a carrier gas as noted above, which can be an argon stream having a flow rate of 1 to 10 L/min. For a furnace 14 having a 43 mm internal diameter, as an example, the above mentioned range of flow rates corresponds to about 0.01 to 0.1 meters/sec. Particles are collected using a vessel, such as a cooled chemical flask 18 connected to the bottom end of the reactor 14, to cool the heated droplets from the heated furnace and condense or agglomerate the droplets containing nanoparticles as shown at 19.

At high temperatures within the reactor tube or furnace 14 (which is heated by external heaters 21 that are controlled by temperature controller 20), the chemical reactions leading to the formation of nanoparticles start taking place. Colloidal nanoparticles are formed inside the droplets and collected at the exit of the reactor, into the chemical flask 18. The carrier gas exits separately at 22. The condensed liquid 19, from the bottom of the collector flask 18, can be continuously collected through a collection port 23.

Direct injection of the mist of droplets into the heated chamber is an important feature of the invention and leads to better results and allows higher throughput than was the case with the system of U.S. Pat. No. 7,160,489. By direct injection or direct location at an end of the furnace is meant the nozzle is sufficiently close to the chamber that the mist cannot appreciably collect on the wall of a duct or tube leading to the furnace chamber.

FIG. 1 also shows the design for a feature for simultaneously and separately collecting wall-coalesced liquid-borne nanoparticles, as well as those that travel through the center of the reactor or furnace 14 and do not interact with the wall. As mentioned above, the particles that have coalesced on the wall of the furnace typically will have a larger size than those collected centrally in the flask 18. A specially designed feature 24 on the bottom part of the reactor is used to ensure the differential collection of materials and to collect the liquid-borne particles streaming down the wall. This liquid can be separately drawn off at 25.

EXAMPLES

Synthesis of cadmium chalcogenides from organic solutions can be achieved in accordance with the invention. One of the first targets was the synthesis of cadmium selenide nanoparticles. The advantage of CdSe nanocrystals over other nanocrystals is that the particle fluorescence covers the whole visible region, so it potentially can be used as a light emitting diode, in solar cells or as a multi-wavelength fluorescent probe (See S. Coe, W.-K. Woo, M. Bawendi, V. Bulovic (2002), "Electroluminescence from single monolayers of nanocrystals in molecular organic devices," Nature, 420: 800-803; I. Gur, N. A. Fromer, M. L. Geier, A. P. Alivisatos (2005), "Air-Stable All-Inorganic Nanocrystal Solar Cells Processed from Solution," Science, 310: 462-466; D. Larson et al (2003), "Water-soluble quantum dots for multiphoton fluorescence imaging in vivo," Science (Washington D.C.) 300: 1434-1436).

The synthesis of CdSe nanocrystals from organic solutions initially used a mixture of trioctyphosphine selenide, cadmium naphthenate, oleic acid and oleylamine, which were atomized using an ultrasonic sprayer and passed through a furnace tube using the apparatus shown in FIG. 1. The reaction of cadmium and selenium precursors proceeded in small droplets of solvent. By adjusting the temperature of the furnace and the residence time of the droplets in the tube it was possible to get nanocrystals with narrow size distribution and good quality.

The procedure for the synthesis is as follows. The mixture of cadmium and selenium precursors is contained in a high boiling point solvent, with the boiling point from about 100° to 400° Celsius (e.g., octadecene, trioctylphosphine, trioctylphosphine oxide, trioctylamine, dioctylamine, stearic acid, hexadecylamine, oleic acid, dodecylamine, etc.), containing a substance that serves as a surface stabilizer (e.g., capable of ligation to the particle surface). Examples of suitable surface stabilizers include trioctylphosphine oxide (TOPO), stearic acid, hexadecylamine, oleic acid, dodecylamine, oleylamine, etc. An aerosol is created using an ultrasonic sprayer (e.g. Sono-Tek) working at 60 kHz ultrasound frequency (or preferably a range of about 20 to 120 kHz). A dense mist is produced and carried by a gas stream, preferably argon, to pass through the tube furnace, whose temperature was controlled in the range from 100° to 400° C. At high enough temperatures, the mixture inside this high boiling point liquid droplet starts reacting and forms surfactant-coated nanometer-sized products. More specifically, the species of the first precursor reactant (cadmium) and second precursor reactant (selenium) react inside the high boiling point liquid droplets and form surfactant-coated nanometer-sized products. These nanometer-sized products then exit the tube furnace and are collected in a cooled container. The container 18 can be a standard spherical glass flask or bubbler made of glass, such as those produced by Chemglass Inc. (of Vineland, N.J.) and other companies.

As mentioned above, the size and size distribution of the resultant nanoparticles can be controlled by adjusting the length of the reactor, furnace temperature, gas and liquid flow rates through the sprayer, and by changing the nature of capping agent (surfactant) and the chemical composition of the solution mixture. Some of these effects have been experimentally verified and the details are described below.

To qualify the resultant quantum dots produced using the method of this invention, the absorbance and fluorescence spectra have been measured for different experimental conditions.

It is well understood that the peak position and width of the right most peak in the absorbance spectrum, as well as the width of the fluorescence spectrum of quantum dots, is an indicative measure of the size and monodispersity of the sample (the narrower this feature the narrower the size distribution of the nanoparticles under testing).

Powder x-ray diffraction spectra (XRD) and transmission electron micrographs (TEM) can be used to examine the crystallinity, size and the size distribution of the final product.

For XRD and TEM measurements, the samples were purified using hexane/methanol mixture, precipitated with acetone and then redissolved in chloroform or hexane. Absorbance spectra were collected using HP8452A UV-Vis spectrophotometer. Fluorescence spectra were obtained with PTI spectrofluorometer.

Figure 2A:
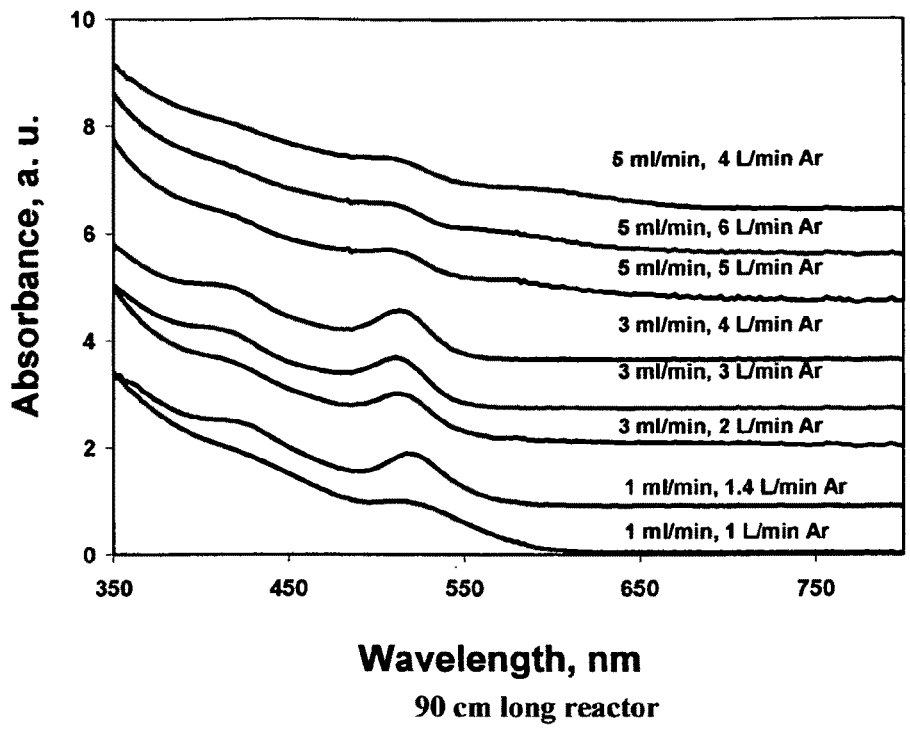
FIGS. 2A and 2B illustrate the effect of the liquid and the gas flow rates through the aerosol generator on the absorbance spectrum of CdSe quantum dots for reactor tubes 90 and 150 cm in length, respectively.
Figure 2B:
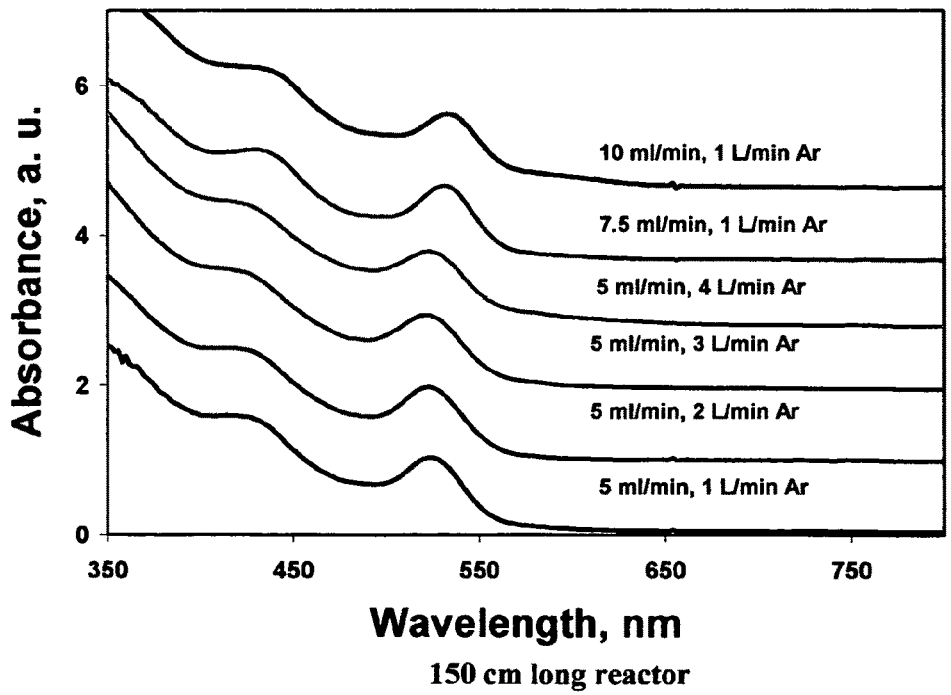

FIGS. 2A and 2B illustrate the effects of the length of the reactor tube, where the absorbance spectra of CdSe quantum dots is plotted for different experimental conditions, and the effect of flow rates of the liquid and the gas through the furnace. Specifically FIG. 2A shows the absorbance spectra of CdSe nanoparticles made with this method for a 90 cm long reactor for different liquid flow rates and gas transport flow rates. For this length reactor, 3 mL/min of liquid flow and between 2-3 L/min of gas flow produces acceptable results, where the right most absorbance spectrum peak is narrow and distinguishable. At higher flow rates this length of the reactor does not support a narrow distribution of sizes (as the absorbance peak gets wider). The same work is repeated in FIG. 2B for a 150 cm long reactor. The optimum conditions in this care are for 7.5 mL/min of liquid flow rate and 1 L/min Ar flow rate, since these experimental conditions produce the narrowest right-most absorbance peak. Thus, if throughput is to be considered (amount of product produced per unit time), then the longer reactor is a better choice since it produces good quality quantum dots (narrow absorbance width) for the highest liquid flow rates of the mixture. The curves for the 150 cm reactor show a general improvement in achieving narrow absorbance width, as compared to the 90 cm reactor.

Figure 3:
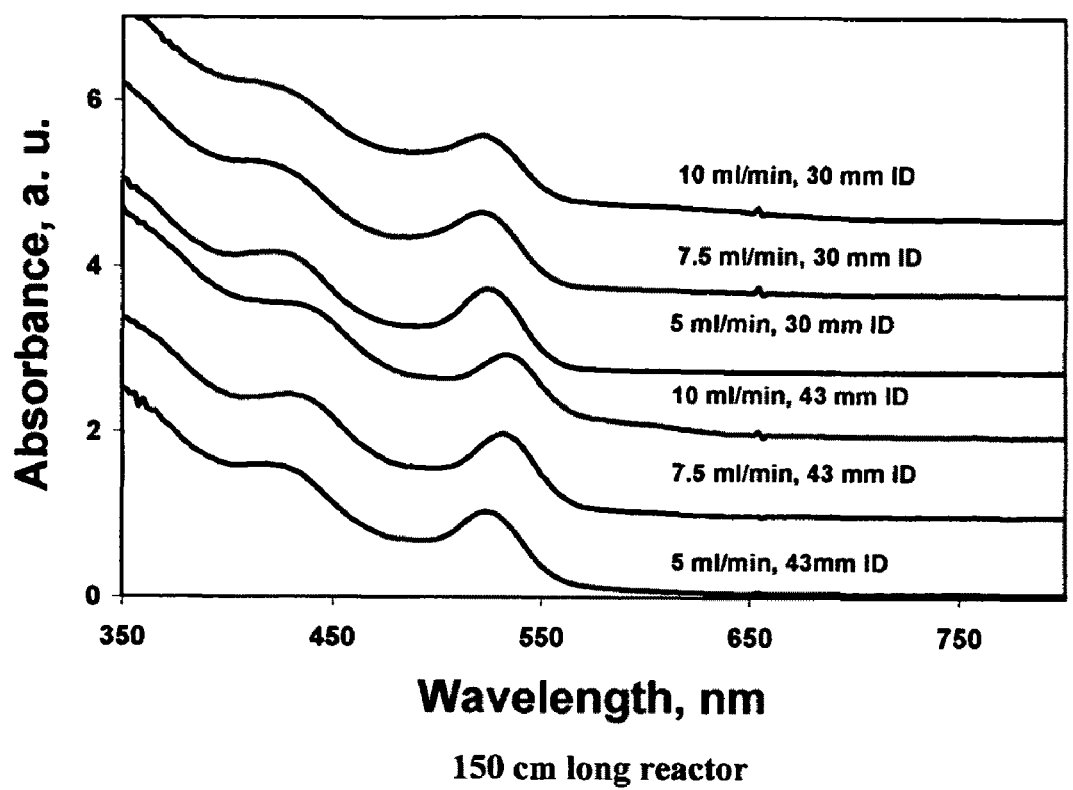
FIG. 3 illustrates the effects on the absorbance spectrum of CdSe/oleylamine nanoparticles obtained by aerosol synthesis at 300° C. at different diameters of the aerosol reactor, with the reactor tube being 150 cm in length.

FIG. 3 illustrates the effects of the diameter of the reactor. The absorbance spectrum of the CdSe nanoparticles produced with this method is plotted for two different diameter reactors, 30 mm ID and 43 mm ID, and for different liquid and gas flow rates. In this example, the reactor length is held the same for both diameters under examination, at 150 cm. The oven temperature is held constant at 300° C. Just as before the narrowest and strongest right-most absorbance peak will determine the best experimental conditions that will produce the best quality (narrowest size distribution) quantum dots. As shown in FIG. 3, the absorbance peak becomes broader for the smaller diameter furnace when the flow rates increase. Thus it is not feasible to get narrow size distribution quantum dots or liquid flow rates higher than 5 mL/min with smaller diameter. In other words, to get a higher throughput of production (larger amount of nanoparticles per unit time) one would have to use the larger diameter reactor, since in that case, even at 7.5 mL/min of liquid flow the quality of the quantum dots is better.

CdSe nanoparticles obtained by this invention procedure from the mixture of cadmium naphthenate, trioctylphosphine selenide, oleic acid and oleylamine at 300° C. were highly fluorescent (quantum yield (QY) about 40%, determined by comparison with the emission from rhodamine 6G) with narrow band emission, full width at half maximum (FWHM) about 26-30 nm.

Figure 4A:
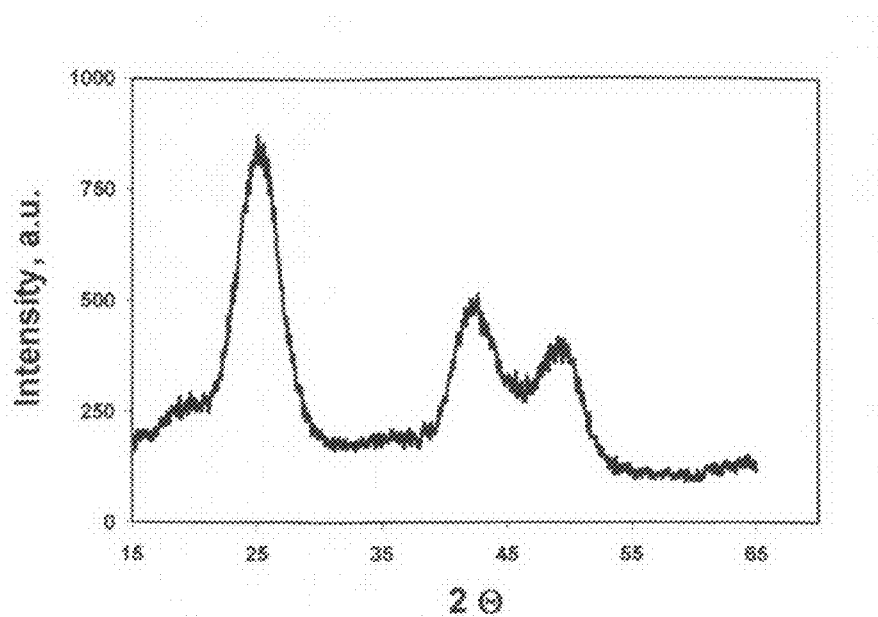
FIGS. 4A and 4B illustrate x-ray diffraction (XRD) and transmission electron microscopy (TEM) of CdSe/oleylamine nanoparticles obtained from aerosol in accordance with the present invention.
Figure 4B:
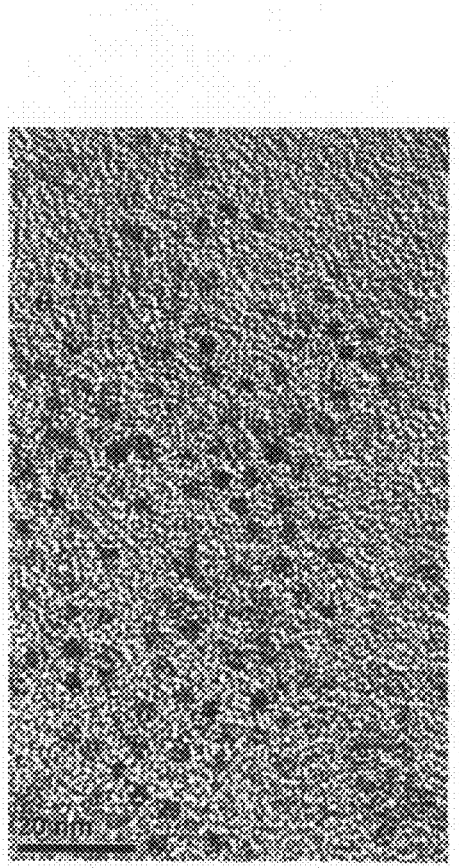

XRD spectra of CdSe nanoparticles made with the method described in this invention are shown in FIG. 4A. The peak positions correspond to cubic structure of CdSe particles. From the width of the peaks of the XRD spectrum, the average size of the nanoparticles can be measured by applying the Scherrer equation to the data, "The Scherrer Formula for X-Ray Particle Size Determination" (November 1939), *Phys. Rev.* VOL: 56, pages 978-982. The measured size from the Scherrer equation is 3.2 nm. FIG. 4B is a (TEM) picture of the same CdSe quantum dots. The scale bar in this figure is 20 nm. From this direct measurement we get a size of 3.5 nm (±0.4 nm), which is in good agreement with the results of the XRD spectra.

Figure 5A:
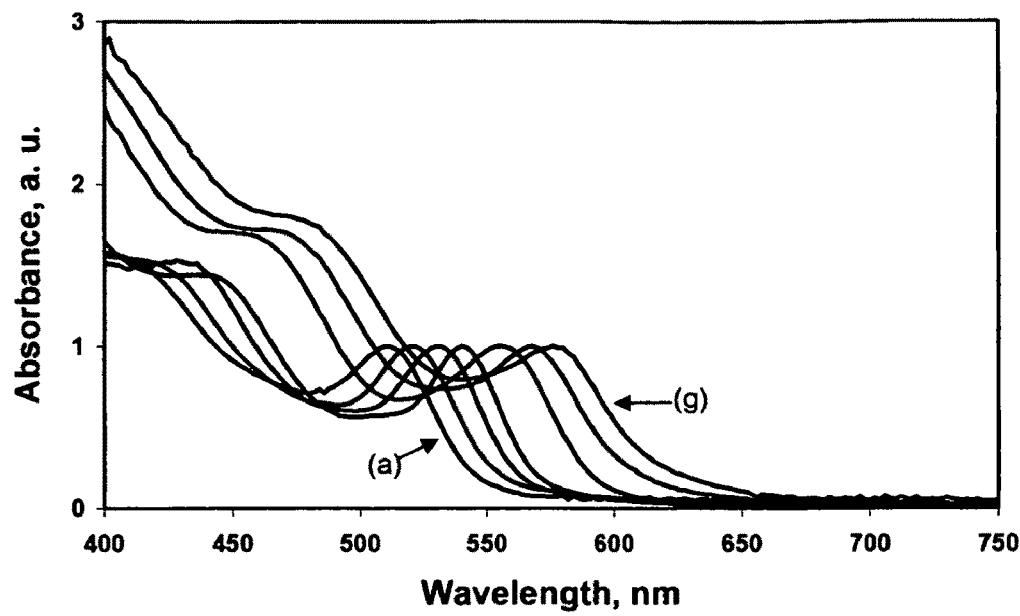
FIGS. 5A and 5B illustrate CdSe quantum dot absorbance and fluorescence spectra respectively obtained by the aerosol method in accordance with the invention using a mixture of cadmium naphthenate, TOPSe, oleic acid and oleylamine at 300° Celsius using different lengths and diameters of furnace; and the ratios of surfactants, oleylamine and oleic acid.
Figure 5B:
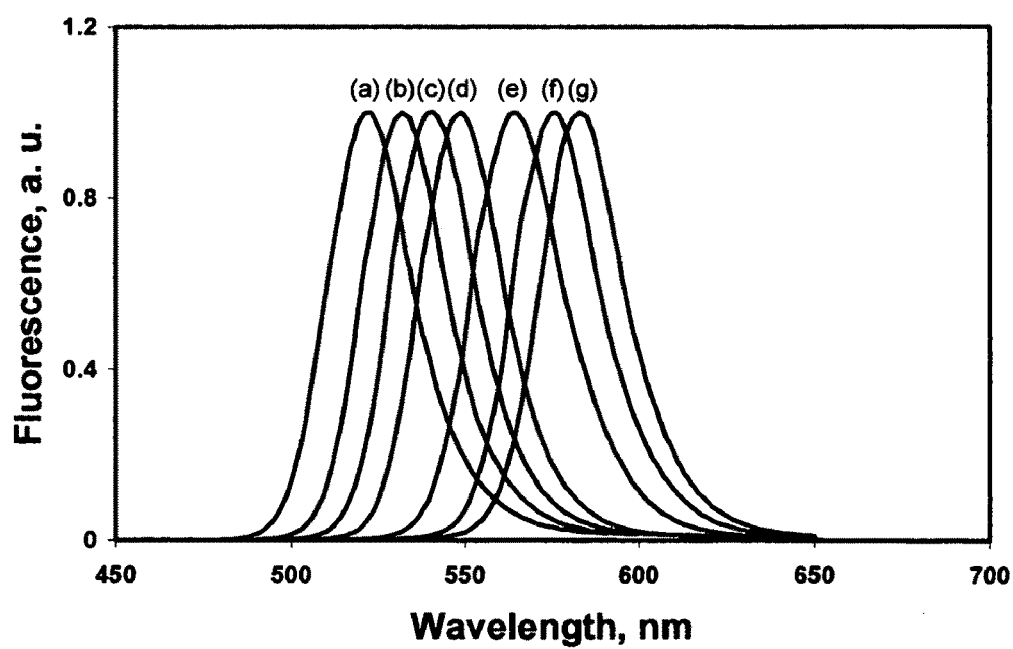

FIGS. 5A and 5B show absorbance and fluorescence spectra, respectively, of nanoparticles so obtained. The reaction mixture is rather versatile and allows for production of q-dots emitting over a broad spectral region by changing the length of the furnace tube, and by the ratio of oleic acid (OA) to oleylamine (OEM) surfactants. CdNP and TOPSe are used for reactants.

In FIG. 5A the effect of the reactor length and the ratio of precursors on the peak position of the absorbance spectrum of CdSe quantum dots is illustrated. Seven different experimental conditions are illustrated, labeled (a) through (g). From left to right: the lengths of reactors are (a): 90 cm, (b): 150 cm, (c):182 cm. For (a) to (c) the ratios of CdNP:OA:OAM are kept constant and equal to 1:5:25. For the next four spectra, the length of the reactor is held constant at 182 cm, while the ratio of oleic acid to oleylamine decreases from left to right as follows: CdNP:OA:OAM=(d) 1:1:25; (e) 1:0.2:15; (f)1:0.1:15; (g) 1:0.1:15. The cadmium concentration in the mixture is the same for experiments (a) through (f) and equal to 0.026M. It is changed to 0.054M for (f).

FIG. 5B shows the corresponding fluorescence spectra of the seven different experimental conditions described above in FIG. 5A. The peak of each spectrum is labeled accordingly.

The size of CdSe quantum dots obtained can be estimated from literature data on the dependence of position of absorbance and fluorescence band versus size. See L. Qu, X. Peng (2001), "Control of Photoluminescence Properties of CdSe Nanocrystals in Growth," *J. Am. Chem. Soc.* 124: 2049-2055; and A. Striolo, J. Ward, J. M. Prausnitz, W. J. Parak, D. Zanchet, D. Gerion, D. Milliron, A. P. Alivisatos (2002), "Molecular Weight, Osmotic Second Virial Coefficient, and Extinction Coefficient of Colloidal Nanocrystals," *J. Phys. Chem. B* 106: 5500-5505. According to these data, the diameter of CdSe nanoparticles obtained in accordance with the present invention should lie in the 2.4-4.0 nm region depending on the conditions of the reaction. This was confirmed by the TEM and XRD results. Fluorescence results are shown in FIG. 5B. More specifically, FIG. 5B shows the fluorescence of CdSe nanoparticles obtained by spray pyrolysis at 300° C. and various ratios of surfactants.

From FIGS. 2, 3 and 5, and corresponding discussions above, it becomes apparent that in order to derive a specific average size and size distribution of nanoparticles using the method described in this invention, one must consider all the parameters described here: reactor diameter, length, and temperature, as well as the chemical mixture ratio of reactants, surfactants, and solvent. They are all important and interrelated in defining the end product.

Many modifications and variations may be made in the techniques and structures described and illustrated herein without departing from the spirit and scope of the present invention. Accordingly, the techniques and structures described and illustrated herein are illustrative only and not limited to the scope of the present invention.

We claim:

1. A process for production of nanometer sized particles, comprising:
   a) combining nanocrystal-forming precursor reactants, high boiling point solvent and surface stabilizers to form a liquid mixture,
   b) continuously passing the liquid mixture through an ultrasonic spray nozzle positioned directly at one end of a heating furnace, to directly inject droplets of the liquid mixture into the furnace,
   c) maintaining the temperature in the heating furnace lower than the boiling point of the solvent so as to prevent any significant evaporation of the solvent, and causing the aerosol droplets to pass through the heating furnace to be heated and to cause a reaction between precursor reactants in the droplets to form nanoparticles; and
   d) collecting the nanoparticles at an opposite end of the heating furnace.

2. The process of claim 1, wherein the heated furnace is at about 100° to 500° C.

3. The process of claim 1, wherein the reaction between precursor reactants proceeds in small droplets of about 40 microns in diameter.

4. The process of claim 1, wherein the reaction between precursor reactants proceeds in small droplets of about 1 to 100 microns in diameter.

5. The process of claim 1 wherein the reactant mixture includes two precursor reactants.

6. The process of claim 1, wherein the precursor reactants comprise a cadmium compound, a zinc compound, a molybdenum compound, a copper compound, a silver compound, a gold compound, a tin compound, a lead compound, a sulfur compound, a selenium compound, or a tellurium compound, a cobalt compound, an iron compound, or a platinum compound.

7. The process of claim 1, wherein the surface stabilizers include a stabilizer selected from the group consisting of trioctylphosphine oxide, stearic acid, oleic acid, oleylamine, hexadecylamine, other amines and acids.

8. The process of claim 1, wherein the high boiling point solvent is selected from the group consisting of alcohols, amines, dimethylformamide, glycol ethers, toluene, octadecene, hexadecane, oleic acid, oleylamine, and dymethylsulfoxide.

9. The process of claim 1, wherein the heated furnace is oriented for vertical travel of the droplets through the furnace, and wherein said one end where the ultrasonic spray nozzle is positioned is the upper end of the furnace.

10. The process of claim 9, wherein the step of collecting the nanoparticles comprises collection in a cooled flask at said opposite end of the heating furnace.

11. The process of claim 9, wherein the process is carried out without any carrier gas, with the droplets traveling down through the furnace by gravity.

12. The process of claim 1, wherein the heated furnace is at about 300° C.

13. The process of claim 1, wherein the ultrasonic spray nozzle vibrates at about 20 kHz to 120 kHz.

14. The process of claim 1, wherein the step of collecting the nanoparticles comprises collection in a cooled flask at said opposite end of the heating furnace.

15. The process of claim 1, further including flowing a carrier gas along with the droplets entering the furnace to move the droplets through the furnace at a desired rate.

16. The process of claim 15, wherein the carrier gas is an inert gas.

17. The process of claim 15, wherein the carrier gas carries a precursor reactant.

18. The process of claim 1, wherein the step of collecting the nanoparticles includes collecting nanoparticles generally centrally from a stream of droplets moving to said opposite end, and separately collecting droplets moving along an internal wall of the heating furnace, whereby nanoparticles having different size ranges are collected separately.

19. The process of claim 15, further including controlling the size, shape, quality and size distribution of nanoparticles by adjusting the length of the heated furnace, the liquid flow rate through the ultrasonic spray nozzle, the gas flow rate through the heated furnace, temperature of the heated furnace and the ratio of components of the liquid mixture.

20. The process of claim 1, including selecting surface stabilizers for the liquid mixture so as to control the size and size distribution of nanoparticles.

21. The process of claim 1, wherein the surface stabilizers include oleic acid and oleylamine, and including controlling the size and size distribution of nanoparticles produced in the process by controlling the ratio of oleic acid to oleylamine, with smaller nanoparticles obtained at higher ratios of oleic acid to oleylamine.

22. The process of claim 21, including in step d) collecting the nanoparticles at a yield of about 1 to 1.5 grams per hour.

23. The process of claim 1, wherein the nanoparticles collected in step d) have a size distribution characterized by full width half maximum of about 28 to 30 nm.

* * * * *